United States Patent [19]
Onishi

[11] Patent Number: 5,981,359
[45] Date of Patent: Nov. 9, 1999

[54] METHOD OF MANUFACTURING SEMICONDUCTOR DEVICE HAVING ISOLATION FILM ON SOI SUBSTRATE

[75] Inventor: Hideaki Onishi, Tokyo, Japan

[73] Assignee: NEC Corporation, Tokyo, Japan

[21] Appl. No.: 08/954,613

[22] Filed: Oct. 20, 1997

[30] Foreign Application Priority Data

Oct. 21, 1996 [JP] Japan .................................. 8-277754

[51] Int. Cl.$^6$ ................................................ H01L 21/762
[52] U.S. Cl. ......................... 438/442; 438/439; 438/297
[58] Field of Search .................................. 438/225, 226, 438/297, 362, 263, 439, 442, 443, 448

[56] References Cited

U.S. PATENT DOCUMENTS

| | | | |
|---|---|---|---|
| 5,304,834 | 4/1994 | Lynch | 257/374 |
| 5,447,885 | 9/1995 | Cho et al. | 438/440 |
| 5,683,933 | 11/1997 | Seino | 438/442 |

FOREIGN PATENT DOCUMENTS

| | | |
|---|---|---|
| 0 421 703 A2 | 4/1991 | European Pat. Off. . |
| 63-245961 | 10/1988 | Japan . |
| 6-204130 | 7/1994 | Japan . |

OTHER PUBLICATIONS

Hong, S. J., et al., "Optimization of Process Condiitions for Quarter Micron Recessed Poly–Si Spacer LOCOS (RPSL) Isolation," International Conference on Solid State Devices and Materials, 1997, pp. 520–521.

Gilbert, P. V., et al., "A PELOX Isolated Sub–0.5 Micron Thin–Film SOI Technology," Symposium on VLSI Technology Digest of Technical Papers, 1995, pp. 37–38.

Sundaram, S. L., et al., "Novel Isolation Process using Selective Polysilicon Filled Trench Technology for High Speed Bipolar Ciecuits," IEEE 1990 Bipolar Circuits and Technology Meeting, 1990, pp. 26–28.

*Primary Examiner*—Olik Chaudhuri
*Assistant Examiner*—Daniel Mao
*Attorney, Agent, or Firm*—Whitham, Curtis & Whitham

[57] ABSTRACT

Disclosed is a method of manufacturing a semiconductor device having a reliable element isolation insulating film on an SOI substrate having an SOI layer. That is, the step of forming a semiconductor device on an SOI substrate includes the steps of sequentially depositing a silicon oxide film and an insulating film resistant to oxidation on the surface of the SOI layer of the SOI substrate to form a stacked film, etching the stacked film into a predetermined pattern shape to expose the SOI layer, selectively forming a thin silicon layer on the exposed SOI layer, and selectively thermally oxidizing the thin silicon layer and the exposed SOI layer by using the stacked film as a thermal oxidization mask. In the thermal oxidization step, all the thin silicon layer and the exposed SOI layer are thermally oxidized to be converted into an element isolation insulating film, and the element isolation insulating film is formed in contact with a buried oxide film below the region. Since the thin silicon layer is selectively formed in advance on the SOI layer to be converted into the element isolation insulating film, the element isolation insulating film is made thick. Even after the process of manufacturing the semiconductor device, a sufficiently thick element isolation insulating film is ensured.

1 Claim, 6 Drawing Sheets

METHOD OF MANUFACTURING SEMICONDUCTOR DEVICE HAVING ISOLATION FILM ON SOI SUBSTRATE

BACKGROUND OF THE INVENTION

1. Field of the Invention

The present invention relates to a method of manufacturing a semiconductor device and, more particularly, to a method of manufacturing an element isolation region of a semiconductor device formed on an SOI (Silicon On Insulator) substrate.

2. Description of the Prior Art

At present, high-breakdown-voltage devices used in power control devices have been available as semiconductor devices mounted on a semiconductor substrate having an SOI structure, i.e., on the SOI layer of an SOI substrate. Further, next-generation CMOS devices which operate at low voltages are fabricated on such an SOI substrate, and the practicability is variously examined.

Of the next-generation CMOS devices, a semiconductor device having a hyperfine CMOS transistor is formed on an SOI substrate having a very thin SOI layer (this semiconductor device will be referred to as an ultrathin SOI device hereinafter). In this case, the SOI layer serving as a channel layer is completely depleted to effectively suppress the short-channel effect.

As the element isolation technique of a semiconductor device mounted on this SOI substrate, LOCOS (Local Oxidation of Silicon) is mainly used, similar to a semiconductor device mounted on a normal bulk silicon substrate. Prior arts about the element isolation technique for the ultrathin SOI device include the one described in "Technical Digest", VLSI Symposium, 1993, pp. 25–26.

The prior art will be described with reference to FIGS. 1A to 1E. FIGS. 1A to 1E are sectional views, respectively, showing the steps in manufacturing an element isolation insulating film on a conventional SOI substrate.

As shown in FIG. 1A, a buried oxide layer 22 is formed on a silicon substrate 21, and an SOI layer 23 is formed on the buried oxide layer 22. The SOI substrate is a SIMOX (Separation by Implanted Oxygen) substrate. The SOI layer 23 is about 60 nm thick, and the buried oxide layer 22 is 400 nm thick.

A silicon oxide film 24 and a silicon nitride film mask 25 are formed and patterned on the SOI layer 23 by photolithography and dry etching. The silicon nitride film mask 25 is changed into an oxide mask, and the exposed SOI layer 23 is thermally oxidized. This thermal oxidation changes the exposed SOI layer 23 into an element isolation insulating film 26, as shown in FIG. 1B. The element isolation insulating film 26 is about 100 nm thick.

A silicon oxide film (not shown) formed on the silicon nitride film mask 25 by thermal oxidation is etched and removed in an aqueous hydrofluoric acid solution. The silicon nitride film mask 25 is etched and removed in an aqueous phosphoric acid solution at about 180° C. The silicon oxide film mask 24 is etched in an aqueous hydrofluoric acid solution. In this manner, the surface of the SOI layer 23 is exposed, as shown in FIG. 1C. The surface of the element isolation insulating film 26 is also etched in etching the silicon oxide film mask 24 to become thin.

As shown in FIG. 1D, the surface of the SOI layer 23 is thermally oxidized to form a protective oxide film 27. Impurity ions are implanted through the protective oxide film 27. By this ion implantation, the impurity concentration in the SOI layer 23 is adjusted to form the channel region of a CMOS transistor.

As shown in FIG. 1E, the protective oxide film 27 on the SOI layer 23 is etched and removed in an aqueous hydrofluoric acid solution. In this etching step, the surface of the element isolation insulating film 26 is further etched to form a residual element isolation insulating film 26a. The residual element isolation insulating film 26a is very thin. Alternatively, the residual element isolation insulating film 26a may not exist, and the buried oxide layer 22 on the silicon substrate 21 may be etched.

In a subsequent step (not shown), the SOI substrate shown in FIG. 1E is thermally oxidized to form a gate oxide film on the surface of the SOI layer 23. A gate electrode is formed on this gate oxide film, and source and drain regions are further formed to form a CMOS transistor.

In the above-described prior art, the dielectric breakdown voltage of the gate oxide film of the CMOS transistor decreases, or the dielectric breakdown voltage varies on the SOI substrate.

As described in the prior art, this is because the thickness of the SOI layer of the ultrathin SOI device greatly decreases to decrease the original thickness of the element isolation insulating film 26. More specifically, if the thickness of the element isolation insulating film 26 decreases in this manner, the element isolation insulating film 26 is easily etched and removed in the process of manufacturing an ultrathin SOI device, as described above. Alternatively, a region where the element isolation insulating film is etched and removed is formed on the SOI substrate, and the buried oxide layer 22 is also partially etched in this region. The buried oxide layer 22 is recessed at the end portion of the SOI layer 23 to form a wedge-shaped end portion of the SOI layer. The dielectric breakdown voltage of the gate oxide film formed at this end portion of the SOI layer greatly decreases.

SUMMARY OF THE INVENTION

It is an object of the present invention to provide a method of manufacturing a semiconductor device having a reliable element isolation insulating film in forming an SOI device.

To achieve this object, according to the present invention, there is provided a method of manufacturing a semiconductor device, comprising, in the step of forming a semiconductor device on an SOI substrate, the steps of sequentially depositing a silicon oxide film and an insulating film resistant to oxidation on a surface of an SOI layer of the SOI substrate to form a stacked film, etching the stacked film into a predetermined pattern shape to expose the SOI layer, selectively forming a thin silicon layer on the exposed SOI layer, and selectively thermally oxidizing the thin silicon layer and the exposed SOI layer by using the stacked film as a thermal oxidization mask.

The thermal oxidization step comprises thermally oxidizing all the thin silicon layer and the exposed SOI layer to be converted into an element isolation insulating film, and the element isolation insulating film is formed in contact with a buried oxide film below the region.

The thin silicon layer is a single-crystal silicon film selectively epitaxially grown, or a single-crystal silicon film which is selectively epitaxially grown, and has a facet plane at an end portion.

Alternatively, the thin silicon layer is a polysilicon film.

In this manner, in the semiconductor device manufacturing method of the present invention, the thin silicon layer is selectively formed in advance on the SOI layer to be converted into the element isolation insulating film. For this reason, the element isolation insulating film is made thick. Even after the process of manufacturing the semiconductor device, a sufficiently thick element isolation insulating film is ensured.

A decrease in breakdown voltage of the gate oxide film of a CMOS transistor mounted on the SOI substrate, large variations in insulation breakdown voltage, or the like which occurs in the prior art, can be prevented. The effects of the present invention become prominent in manufacturing an ultrathin SOI device.

DETAILED DESCRIPTION OF PREFERRED EMBODIMENTS

The present invention will be described below with reference to the accompanying drawings.

The first embodiment of the present invention will be described with reference to FIGS. 2A to 2F. FIGS. 2A to 2F are sectional views, respectively, showing the manufacturing steps to explain a method of manufacturing a semiconductor device according to the present invention. The following embodiments will exemplify a case wherein a fabricated SOI layer finally has a thickness of about 30 nm.

Figure 1A:
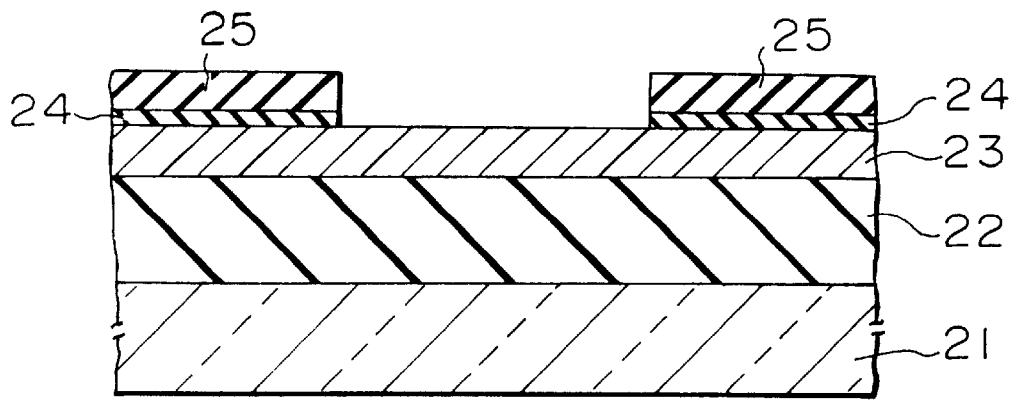
FIGS. 1A to 1E are sectional views, respectively, showing the steps in manufacturing an element isolation insulating film on a conventional SOI substrate.
Figure 1B:
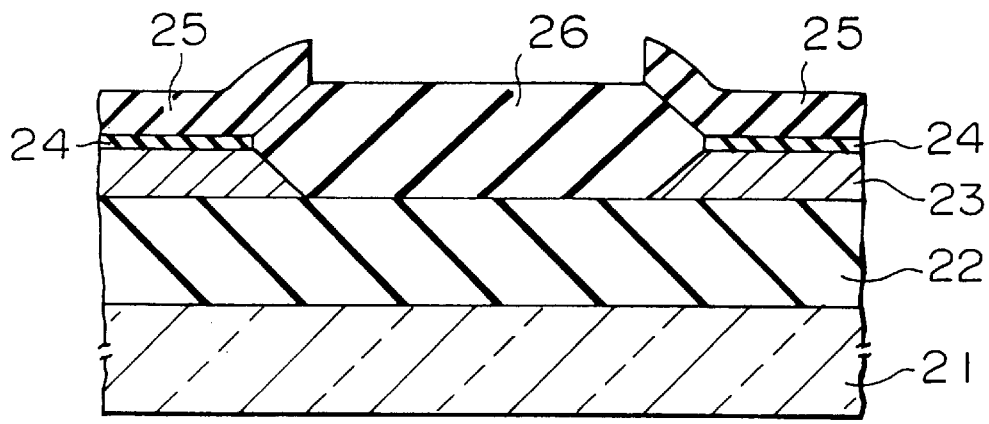
Figure 1C:
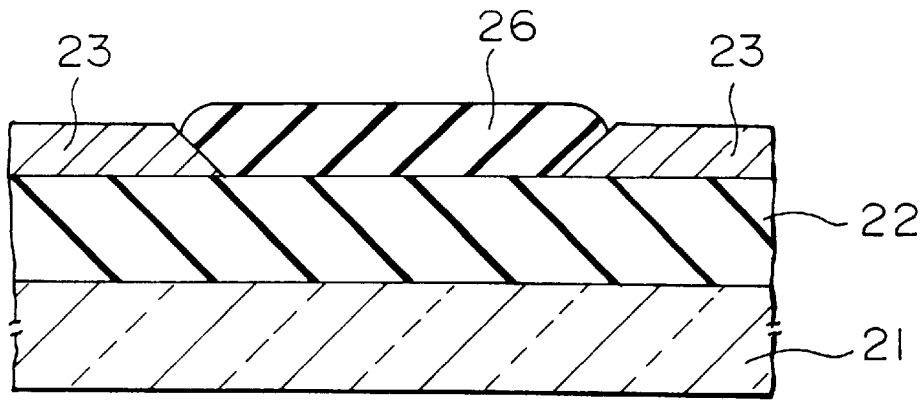
Figure 1D:
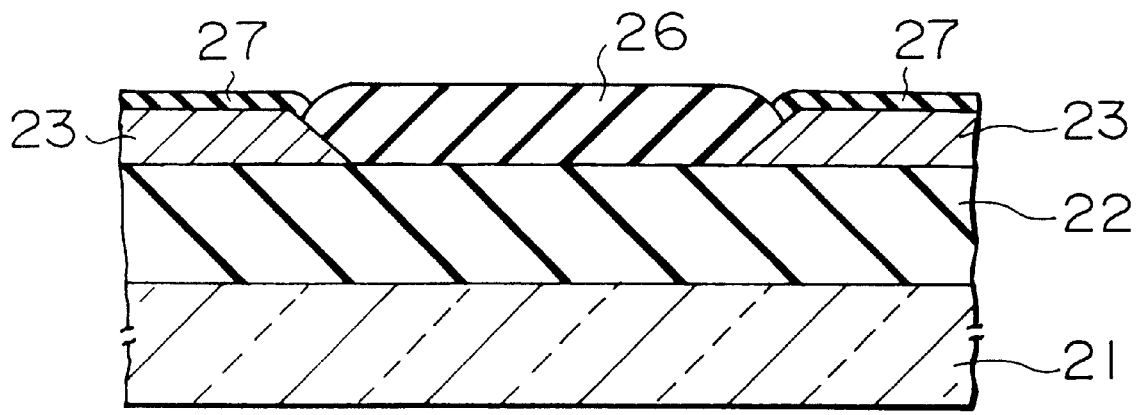
Figure 1E:
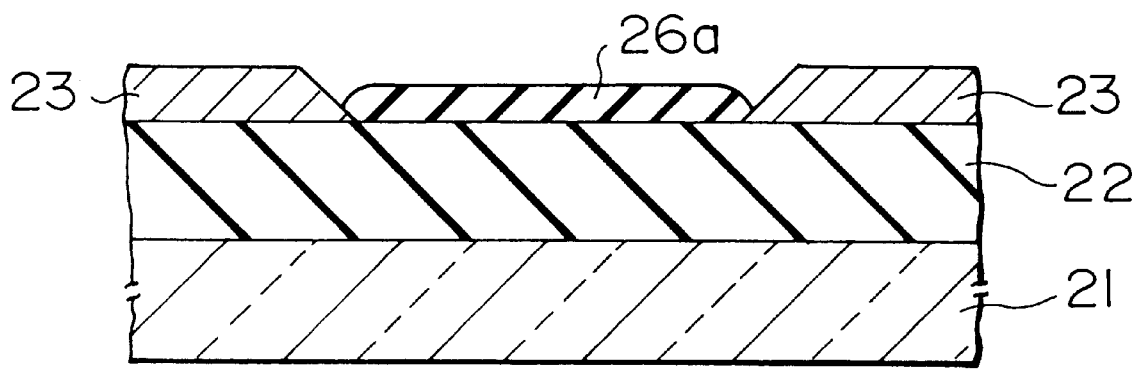
Figure 2A:
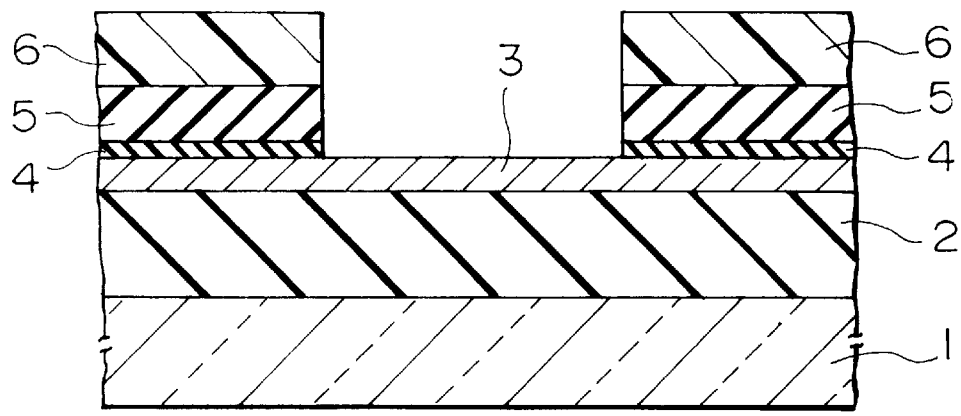
FIGS. 2A to 2F are sectional views, respectively, showing the manufacturing steps to explain a method of manufacturing a semiconductor device according to the first embodiment of the present invention.

As shown in FIG. 2A, a buried oxide layer 2 is formed on a silicon substrate 1, and an SOI layer 3 is formed on the buried oxide layer 2. As described in the prior art, the SOI substrate is a SIMOX substrate, and the thicknesses of the SOI layer 3 and the buried oxide layer 2 are respectively set at 60 nm and 400 nm.

A 30-nm thick silicon oxide film 4 is formed on the surface of the SOI layer 3 by thermal oxidation, and a silicon nitride film 5 is deposited on the silicon oxide film 4 by chemical vapor deposition (CVD). The silicon nitride film 5 is about 150 nm thick. A resist mask 6 is formed by photolithography. Using the resist mask 6 as a mask, the silicon nitride film 5 and the silicon oxide film 4 are dry-etched. In this manner, the silicon oxide film mask 4 and the silicon nitride film mask 5 are formed on the SOI layer 3, as shown in FIG. 2A.

Figure 2B:
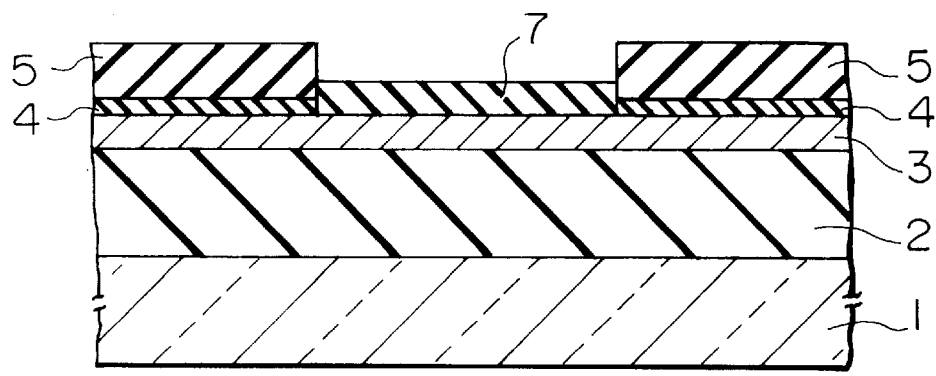

Then, the resist mask 6 is removed. As shown in FIG. 2B, an epitaxial layer 7 is formed in a region where the SOI layer 3 is exposed. In this case, the epitaxial layer 7 is a single-crystal silicon film having a thickness of 50 nm, which is selectively deposited as follows. That is, $Si_2H_6$ and $Cl_2$ gases are used as a reaction gas, and the film formation temperature is set at about 750° C. By UHV (Ultra High Vacuum) CVD under these conditions, a single-crystal silicon film is selectively epitaxially grown on only the surface of the exposed SOI layer 3.

Figure 2C:
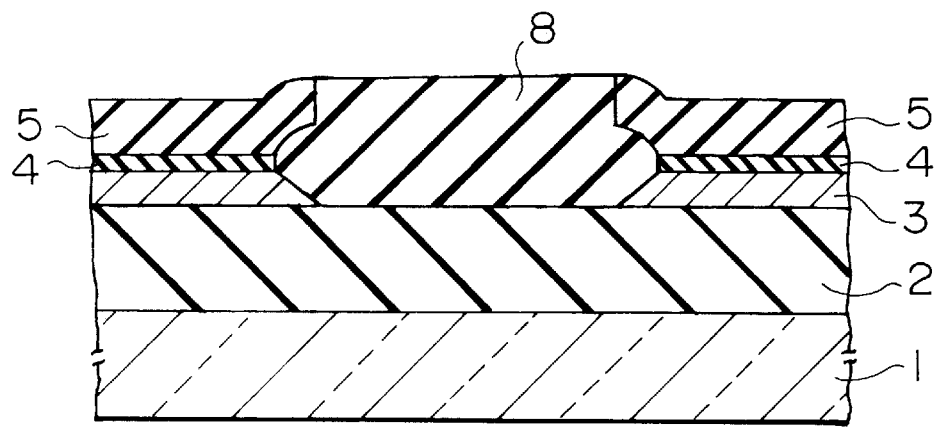

The silicon nitride film 5 is changed into an oxide mask, and the epitaxial layer 7 and the SOI layer 3 there-below are thermally oxidized. This thermal oxidation changes the epitaxial layer 7 and the SOI layer 3 therebelow into an element isolation insulating film 8, as shown in FIG. 2C. The element isolation insulating film 8 is about 210 nm thick.

Figure 2D:
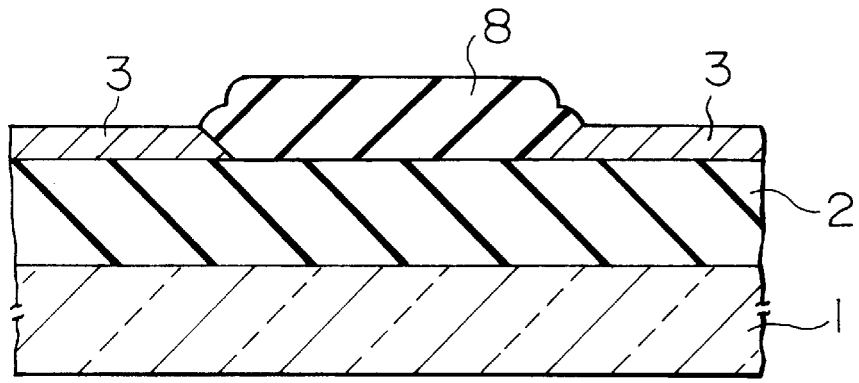

Similar to the prior art, a silicon oxide film formed on the silicon nitride film mask 5 by thermal oxidization is etched and removed in an aqueous hydrofluoric acid solution. The silicon nitride film mask 5 is etched and removed in a hot aqueous phosphoric acid solution. The silicon oxide film mask 4 is etched in an aqueous hydrofluoric acid solution. In this manner, the surface of the SOI layer 3 is exposed, as shown in FIG. 2D. In the step of etching the silicon oxide film, the surface of the element isolation insulating film 8 is etched to about 60 nm to become thin.

Figure 2E:
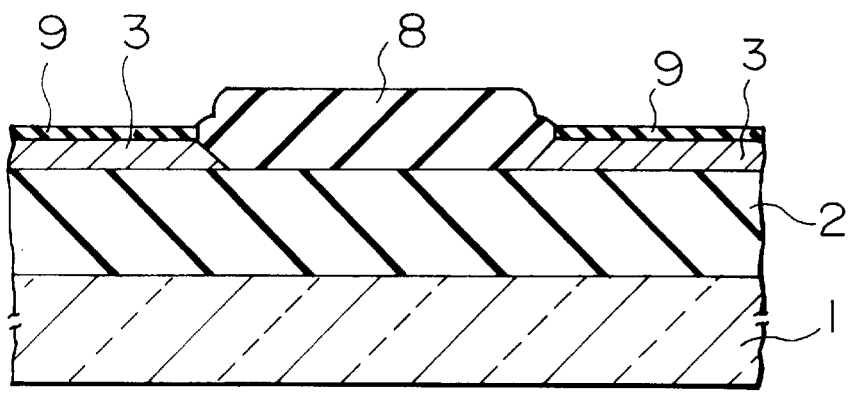

As shown in FIG. 2E, the surface of the SOI layer 3 is thermally oxidized to form a protective oxide film 9. The thickness of the protective oxide film 9 is set at about 15 nm. Impurity ions are implanted through the protective oxide film 9. By this ion implantation, the impurity concentration in the SOI layer 3 is adjusted to form the channel region of a CMOS transistor.

Figure 2F:
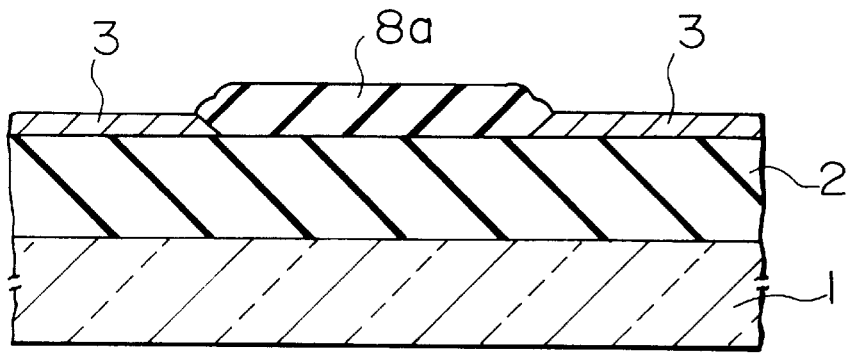

As shown in FIG. 2F, the protective oxide film 9 on the SOI layer 3 is etched and removed in an aqueous hydrofluoric acid solution. In this etching step, the surface of the element isolation insulating film 8 is further etched by about 30 nm to form a residual element isolation insulating film 8a. At this time, the residual element isolation insulating film 8a has a thickness of 100 nm or more.

In a subsequent step (not shown), a gate oxide film is formed on the surface of the SOI layer 3, as described in the prior art. A gate electrode is formed on this gate oxide film, and source and drain regions are further formed to form a CMOS transistor.

In this embodiment, the selectively formed epitaxial layer 7 is also thermally oxidized and changed into a silicon oxide film. Accordingly, the element isolation insulating film 8 has a thickness about 2 times that in the prior art.

According to the manufacturing method of the present invention, a thick element isolation insulating film can be easily formed even in an ultrathin SOI device. For this reason, the gate oxide film is free from any decrease in insulation breakdown voltage caused by a decrease in thickness of the element isolation insulating film which is described in the "DESCRIPTION OF THE PRIOR ART". Alternatively, variations in insulation breakdown voltage greatly reduce.

Figure 3A:
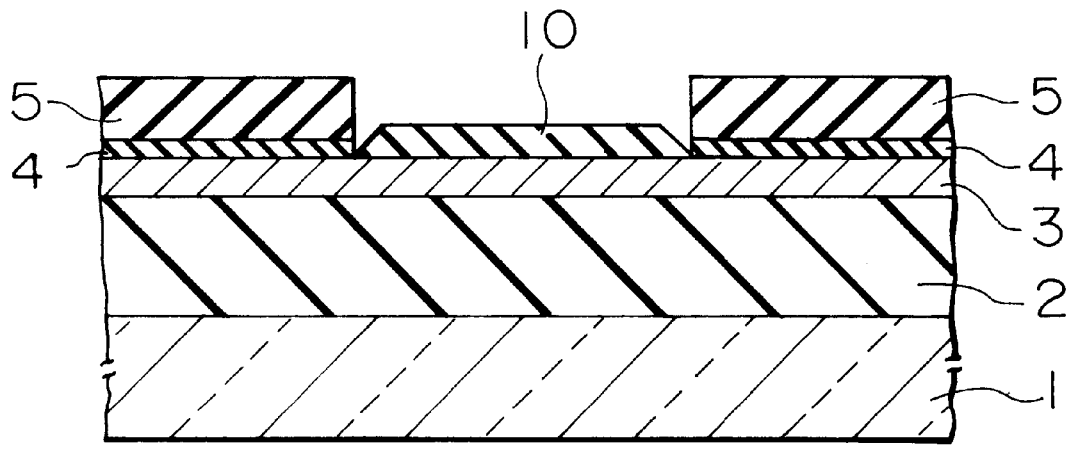
FIGS. 3A and 3B are sectional views, respectively, showing the manufacturing steps to explain a method of manufacturing a semiconductor device according to the second embodiment of the present invention.
Figure 3B:
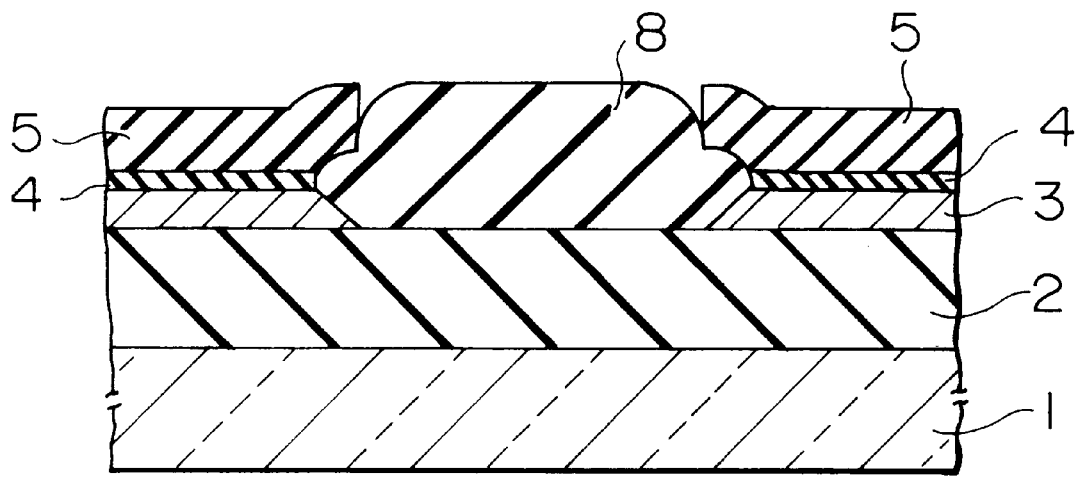

The second embodiment of the present invention will be described with reference to FIGS. 3A and 3B. FIGS. 3A and 3B are sectional views, respectively, showing the manufacturing steps to explain a method of manufacturing a semiconductor device according to the second embodiment of the present invention. The second embodiment is different from the first embodiment in that an epitaxial layer formed on an exposed SOI layer has a facet plane, and this difference will be mainly explained below.

As shown in FIG. 3A, a buried oxide layer 2 is formed on a silicon substrate 1, similar to the first embodiment. An SOI layer 3 is formed on the buried oxide layer 2. The thicknesses of the SOI layer 3 and the buried oxide layer 2 are respectively set at 40 nm and 200 nm.

A 15-nm thick silicon oxide film 4 is formed on the surface of the SOI layer 3 by thermal oxidization, and a silicon nitride film 5 is deposited on the silicon oxide film 4 by CVD. The silicon nitride film 5 is about 100 nm thick. The silicon nitride film 5 and the silicon oxide film 4 are patterned by photolithography and dry etching. In this manner, the silicon oxide film mask 4 and the silicon nitride film mask 5 are formed on the SOI layer 3.

An epitaxial layer 10 is formed in a region where the SOI layer 3 is exposed. In this case, the epitaxial layer 10 is a single-crystal silicon film having a thickness of 60 nm, and has a facet plane.

The epitaxial layer 10 is selectively deposited as follows. That is, $Si_2H_6$ and $Cl_2$ gases are used as a reaction gas, and the film formation temperature is set at about 850° C. By UHV-CVD under these conditions, a single-crystal silicon film is selectively epitaxially grown on only the surface of the exposed SOI layer 3.

In this case, when the SOI layer 3 has a {100} crystal plane, the facet plane is a {111} plane, a {311} plane, or the like. To form a facet plane with a good shape, the pattern end portions of the silicon oxide film mask 4 and the silicon nitride film mask 5 are set to have an orientation of <110>.

As shown in FIG. 3B, the silicon nitride film 5 is changed into an oxide mask, and the epitaxial layer 10 and the SOI layer 3 therebelow are thermally oxidized. This thermal oxidation changes the epitaxial layer 10 and the SOI layer 3 therebelow into an element isolation insulating film 8. The element isolation insulating film 8 is about 210 nm thick.

The subsequent steps are the same as in the first embodiment, and a description thereof will be omitted.

In the second embodiment, the facet plane is formed at the end portion of the epitaxial layer 10. For this reason, the thermal stress in thermal oxidization for forming the element isolation insulating film 8 is smaller than that in the first embodiment. Crystal defects introduced to the SOI layer are reduced.

Oxidization at the end portion of the epitaxial layer 10, i.e., at the end portion of the silicon oxide film 4 is facilitated, and the epitaxial layer 10 is completely converted into a silicon oxide film by thermal oxidization within a short time. If no facet plane exists at the end portion of the epitaxial layer 10, thermal oxidization in this region is slow, resulting in a long oxidation time.

Figure 4A:
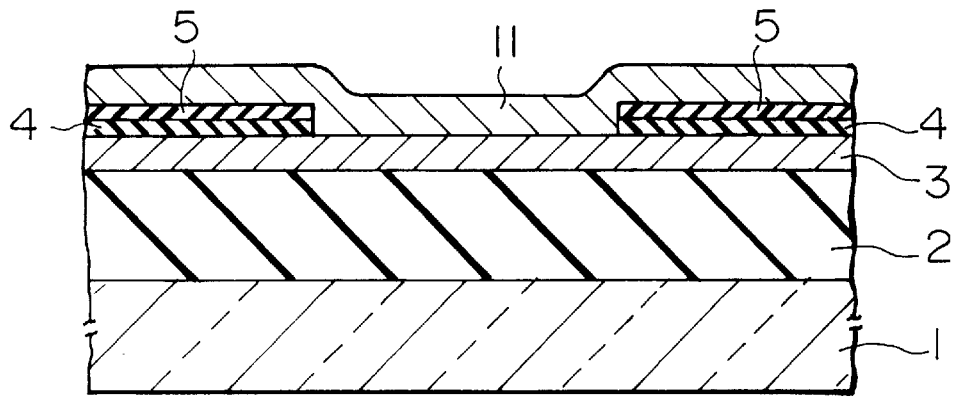
FIGS. 4A to 4C are sectional views, respectively, showing the manufacturing steps to explain a method of manufacturing a semiconductor device according to the third embodiment of the present invention.
Figure 4B:
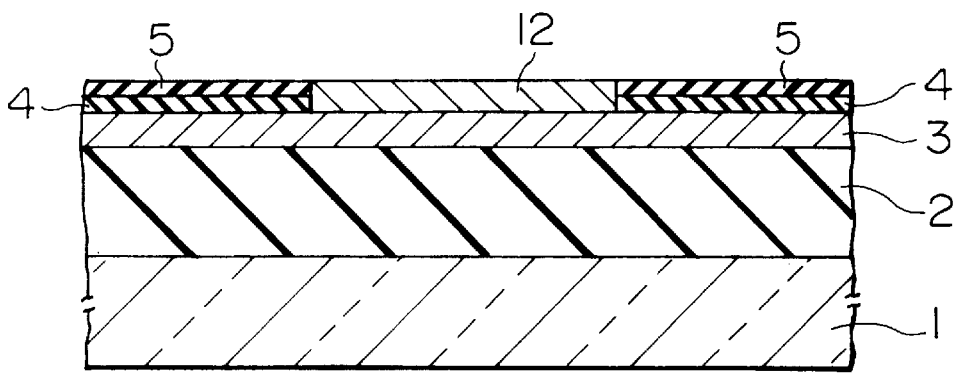
Figure 4C:
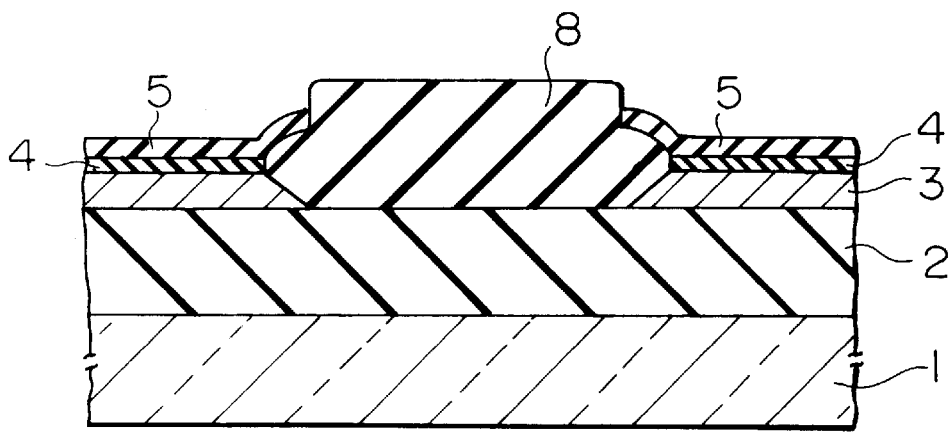

The third embodiment of the present invention will be described with reference to FIGS. 4A to 4C. FIGS. 4A to 4C are sectional views, respectively, showing the manufacturing steps to explain a method of manufacturing a semiconductor device according to the third embodiment of the present invention.

As shown in FIG. 4A, a buried oxide layer 2 is formed on a silicon substrate 1, similar to the first embodiment. An SOI layer 3 is formed on the buried oxide layer 2. The thicknesses of the SOI layer 3 and the buried oxide layer 2 are respectively set at 50 nm and 400 nm.

A 15-nm thick silicon oxide film 4 is formed on the surface of the SOI layer 3 by thermal oxidization, and a silicon nitride film 5 is deposited on the silicon oxide film 4 by CVD. The silicon nitride film 5 is about 50 nm thick. The silicon nitride film 5 and the silicon oxide film 4 are patterned by photolithography and dry etching. In this manner, the silicon oxide film mask 4 and the silicon nitride film mask 5 are formed on the SOI layer 3.

As shown in FIG. 4A, a thin polysilicon film 11 is deposited on the entire surface of the SOI substrate by CVD. The thin polysilicon film 11 is about 80 nm thick.

The thin polysilicon film 11 is polished by chemical mechanical polishing (CMP). At this time, the silicon nitride film mask 5 functions as a CMP stopper layer. In this manner, a polysilicon layer 12 is formed on the exposed SOI layer 3 so as to be buried between the patterned silicon oxide film mask 4 and the patterned silicon nitride film mask 5, as shown in FIG. 4B. The polysilicon layer 12 is about 50 nm thick.

The silicon nitride film 5 is changed into an oxide mask, and the polysilicon layer 12 and the SOI layer 3 therebelow are thermally oxidized. This thermal oxidation changes the polysilicon layer 12 and the SOI layer there-below into an element isolation insulating film 8, as shown in FIG. 4C. The element isolation insulating film 8 on the buried oxide layer 2 is about 200 nm thick.

The subsequent steps are the same as in the first embodiment, and a description thereof will be omitted.

In the above embodiments, the epitaxial layer or the polysilicon layer may contain an impurity such as phosphorus or boron.

What we claim is:

1. A method of manufacturing a semiconductor device, comprising, in the step of forming a semiconductor device on an SOI substrate, the steps of:

sequentially depositing a silicon oxide film and an insulating film resistant to oxidation on a surface of an SOI layer of said SOI substrate to form a stacked film;

etching said stacked film into a predetermined pattern shape to expose said SOI layer;

selectively forming a thin single-crystal silicon film on said exposed SOI layer which is selectively epitaxially grown, and has a facet plane at an end portion; and selectively thermally oxidizing said thin silicon layer and said exposed SOI layer by using said stacked film as a thermal oxidization mask.

* * * * *